(12) United States Patent
Ishida et al.

(10) Patent No.: US 7,809,460 B2
(45) Date of Patent: Oct. 5, 2010

(54) COATING AND DEVELOPING APPARATUS, COATING AND DEVELOPING METHOD AND STORAGE MEDIUM IN WHICH A COMPUTER-READABLE PROGRAM IS STORED

(75) Inventors: Seiki Ishida, Koshi (JP); Taro Yamamoto, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 969 days.

(21) Appl. No.: 11/608,426

(22) Filed: Dec. 8, 2006

(65) Prior Publication Data

US 2007/0134600 A1    Jun. 14, 2007

(30) Foreign Application Priority Data

Dec. 8, 2005    (JP) ............................. 2005-355285

(51) Int. Cl.
```
G06F 19/00      (2006.01)
B28B 19/00      (2006.01)
B29B 15/10      (2006.01)
C23C 18/00      (2006.01)
C23C 26/00      (2006.01)
H01C 17/06      (2006.01)
H05K 3/00       (2006.01)
H01L 21/20      (2006.01)
H01L 21/31      (2006.01)
H01L 21/469     (2006.01)
```
(52) U.S. Cl. ................... 700/121; 427/96.1; 438/584; 438/758

(58) Field of Classification Search ............... 700/117, 700/121; 427/96.1, 96.2, 96.6; 430/313, 430/325, 327, 328, 330; 438/5, 6, 584, 758, 438/948, 949

See application file for complete search history.

(56) References Cited

U.S. PATENT DOCUMENTS

2006/0081461 A1* 4/2006 Jomen et al. ............. 204/275.1
2008/0137056 A1* 6/2008 Fujiwara et al. ............. 355/72
2008/0274433 A1* 11/2008 Takaki et al. ................ 430/325

FOREIGN PATENT DOCUMENTS

| JP | 06029270 A  | * | 2/1994 |
| JP | 10189412 A  | * | 7/1998 |
| JP | 2004-193597 |   | 7/2004 |
| JP | 2005-175079 |   | 6/2005 |

* cited by examiner

Primary Examiner—Crystal J Barnes-Bullock
(74) Attorney, Agent, or Firm—Oblon, Spivak, McClelland, Maier & Neustadt, L.L.P.

(57) ABSTRACT

A coating and developing apparatus comprises a washing section for washing the surface of a substrate after it has been subjected to a dipping exposure process in an exposing apparatus, and a first substrate carrying means adapted to transfer the substrate carried out from the exposing apparatus after the dipping exposure process to the washing section. The first substrate carrying means is controlled by a control means. Namely, the control means controls the first substrate carrying means such that the substrate can be washed in the washing section in a period of time prior to a time zone in which the size of liquid drops remaining on the substrate due to the dipping exposure process becomes smaller quite rapidly, based on a carrying-out ready signal for the substrate from the exposing apparatus, by using a relationship between the time elapsed from the end of the dipping exposure process and the size of liquid drops remaining on the substrate due to the dipping exposure process.

15 Claims, 10 Drawing Sheets

COATING AND DEVELOPING APPARATUS, COATING AND DEVELOPING METHOD AND STORAGE MEDIUM IN WHICH A COMPUTER-READABLE PROGRAM IS STORED

BACKGROUND OF THE INVENTION

1. Field of the Invention

The present invention is a coating and developing apparatus, and a coating and developing method for coating a resist liquid on a surface of a substrate and developing the substrate after a dipping exposure process.

2. Background Art

A method for forming a resist pattern on a substrate, such as a glass substrate for use in a semiconductor wafer (hereinafter referred to as a "wafers") or LCD (Liquid Crystal Display) is carried out in a system composed by connecting a coating and developing apparatus comprising a coating section for coating a resist liquid on a substrate and a developing section for developing the substrate after exposure with an exposing apparatus.

In an exposing technique of an exposing apparatus, in order to enhance resolution by improving the exposing technique employing an existing light source, for example, argon fluoride (ArF) or krypton fluoride (KrF), there is a method of exposing a surface of a substrate with an optically transparent liquid layer being formed thereon (hereinafter, this method is referred to as a "dipping exposure method"). An exposing apparatus for performing such a dipping exposure process is explained briefly with reference to FIG. 11. Above a wafer W held horizontally by a holding mechanism (not shown), an exposing means 1 is arranged to face a surface of the wafer W with a gap. At a central distal portion of the exposing means 1, a lens 10 is provided. At the outer periphery of the lens 10, a feeding port 11 for feeding a solution, for example, pure water for forming a liquid layer on the surface of wafer W, and an aspirating port 12 for aspirating and collecting pure water fed to the wafer W are provided, respectively. In this case, by feeding pure water onto the surface of wafer W from the feeding port 11 while collecting the pure water by using the aspirating port 12, a liquid layer (pure water layer) is formed between the lens 10 and the surface of wafer W. Thereafter, light is emitted from a light source (not shown), passes through the lens 10, and is transmitted through the liquid layer and radiated onto the wafer W. In this way, a predetermined circuit pattern is transferred to the resist coated on the wafer W.

Subsequently, for example, as shown in FIG. 12, while the liquid layer is formed between the lens 10 and the surface of the wafer W, an exposing means 1 is driven to slide laterally such that the exposing means 1 is located at a position corresponding to a next transfer region (shot region) 13. Then, by repeating the operation to irradiate the wafer W with light, predetermined circuit patterns are successively transferred to the resist on the surface of the wafer W. It is noted that the shot region 13 is depicted in a larger than actual size.

Before performing a dipping exposure process after the resist liquid is coated on the wafer, in order to control elution of the resist and render water drops generated upon the dipping exposure process difficult to remain on the wafer surface, formation of a water-repellent protective film on the surface of the wafer has been studied (Patent Document 1).

However, the wafer is often transferred from the exposing apparatus to the coating and developing apparatus while water drops still remain on the wafer. In such a case, when heating is provided to the wafer W after exposure, if water drops exist on the wafer, the temperature at sites on which the water drops remain becomes different from other regions, leading to causing an adverse effect on the pattern resolution just below such sites. Therefore, it is necessary to wash the surface of the wafer after exposure to remove water drops.

To address this problem, provision of a washing apparatus to the coating and developing apparatus has been studied. After attaching onto a wafer W, water drops gradually become small in size with time, and the size becomes smaller quite rapidly at a certain point of time. When the timing of washing the wafer is later than the point of time the size of water drops become smaller quite rapidly, the water drops will soak into the protective film and reach the surface of the resist film, thus forming layers insoluble to a developing liquid or the so-called water marks. In such a case, uniformity of the line width of the circuit pattern will be adversely affected.

Generally, in order to avoid generation of particles, a peripheral portion of a wafer is first exposed in a periphery exposing section for the wafer before subjected to a primary exposure process, and a resist portion at the periphery of the wafer is then removed when a developing liquid is supplied. However, since the protective film tends to be damaged upon the periphery exposing process, it has been examined to perform the periphery exposing process after a wafer to be processed is returned from the exposing apparatus to the coating and developing apparatus.

Meanwhile, for a resist of a chemically amplified type, in order to control the degree of diffusion of an acid to be produced upon exposure, it is preferred to adjust the time (PED time) to be taken from a point of time a wafer is exposed to a point of time of starting a heating process. In the case of using a heating section in which a heating plate and a cooling plate which also serves as an exclusive arm for a wafer are incorporated, for example, it is attempted to make the PED time constant by placing a wafer on the cooling plate so as to adjust the waiting time (Patent Document 2).

However, in the method of performing the adjustment of the PED time by using the cooling plate, the number of heating sections becomes large, leading to increase of the cost. To address this issue, if attempting to provide a waiting section such that a wafer can be transferred from the waiting section to a heating section after the adjustment of the PED time has been provided to the wafer in the waiting section, significant variation of the time from carrying-in to carrying-out of the wafer at the washing section or periphery exposing section occurs due to operating properties of a wafer carrying arm, thus increasing the range of adjusting time in the waiting section. In particular, since the number of modules in which each wafer is carried is increased by one due to the provision of the washing section, the control program for the wafer carrying arm should take much time to be well devised in order to ensure a desirably high throughput. On the other hand, if the difference of timings to carry each wafer out of the waiting section is too large, the control of the wafer carrying arm becomes significantly difficult (of course, this problem will not occur if the throughput is disregarded).

Patent Document 1: TOKUKAI No. 2005-175079, KOHO
Patent Document 2: TOKUKAI No. 2004-193597, KOHO

SUMMARY OF THE INVENTION

The present invention was made in light of the above situation. It is therefore an object of this invention to provide a technique for controlling an adverse effect on resolution of a resist pattern to be caused by water drops remaining on the substrate due to a dipping exposure process, in an apparatus for forming a resist film on a substrate and providing a developing process to the substrate after being subjected to a dipping exposure process.

It is another object of the present invention to provide a technique for providing a periphery exposing process to a substrate which has been subjected to a dipping exposure process as well as for adjusting the time taken from the end of the exposure to start of a heating process.

The present invention is a coating and developing apparatus including a coating unit adapted to coat a resist liquid on a substrate so as to form a resist film, a heating section adapted to heat the substrate after it has been subjected to a dipping exposure process in an exposing apparatus, and a developing section adapted to perform a developing process, the coating and developing apparatus comprising: a washing section adapted to wash the surface of each substrate after it has been subjected to the dipping exposure process; a first substrate carrying means adapted to transfer each substrate to the washing section, the substrate having been subjected to the dipping exposure process and carried out from the exposing apparatus; and a control section adapted to control the first substrate carrying means such that the substrate can be washed in the washing section in a period of time prior to a time zone in which the size of liquid drops remaining on the substrate due to the dipping exposure process becomes smaller quite rapidly, based on a carrying-out ready signal for the substrate from the exposing apparatus, by using a relationship between the time elapsed after the end of the dipping exposure process and the size of liquid drops remaining on the substrate due to the dipping exposure process.

The present invention is the coating and developing apparatus, wherein the first substrate carrying means is configured to transfer each substrate prior to exposure to a carrying-in stage for carrying the substrate into the exposing apparatus as well as to receive the substrate after exposure from a carrying-out stage for carrying the substrate out of the exposing apparatus and carry it into the washing section, and wherein the control section controls the first substrate carrying means such that the substrate on the carrying-out stage can be carried into the washing section, in preference to other carrying works, upon receiving the carrying-out ready signal for the substrate from the exposing apparatus.

The present invention is the coating and developing apparatus, further comprising: a waiting section adapted to bring each substrate washed in the washing section into a waiting state; a periphery exposing section adapted to provide exposure to the periphery of the substrate carried out from the waiting section prior to a heating process in the heating section; and a second substrate carrying means adapted to take out the substrate from the waiting section and carry it into the periphery exposing section, and further carry the substrate from the periphery exposing section to the heating section; wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

The present invention is the coating and developing apparatus, further comprising a protective film forming section adapted to form a water-repellent protective film for protecting the surface of each substrate upon a dipping exposure process, by coating a chemical liquid on a resist film coated on the substrate in a coating unit.

The present invention is the coating and developing apparatus, further comprising: a waiting section adapted to bring a substrate washed in the washing section into a waiting state; a periphery exposing section adapted to provide exposure to the periphery of the substrate carried out from the waiting section prior to a heating process in the heating section; and a second substrate carrying means adapted to take out the substrate from the waiting section and carry it into the periphery exposing section, and further carry the substrate from the periphery exposing section to the heating section; wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

The present invention is the coating and developing apparatus, further comprising a protective film forming section adapted to form a water-repellent protective film for protecting the surface of each substrate upon a dipping exposure process, by coating a chemical liquid on a resist film coated on the substrate in a coating unit.

The present invention is another coating and developing apparatus, further comprising a protective film forming section adapted to form a water-repellent protective film for protecting the surface of each substrate upon a dipping exposure process, by coating a chemical liquid on a resist film coated on the substrate in a coating unit.

The present invention is a coating and developing method including the steps of forming a resist film by coating a resist liquid on a substrate, heating the substrate in a heating section, the substrate having been subjected to a dipping exposure process in an exposing apparatus, and then performing a developing process in a developing section, the method comprising the steps of: carrying the substrate carried out from the exposing apparatus after the dipping exposure process into a washing section, by using a first substrate carrying means; and washing the surface of the substrate in the washing section; wherein a control section controls the first substrate carrying means such that the substrate can be washed in the washing section in a period of time prior to a time zone in which the size of liquid drops remaining on the substrate due to the dipping exposure process becomes smaller quite rapidly, based on a carrying-out ready signal for the substrate from the exposing apparatus, by using a relationship between the time elapsed after the end of the dipping exposure process and the size of liquid drops remaining on the substrate due to the dipping exposure process.

The present invention is the coating and developing method, wherein the first substrate carrying means is configured to transfer each substrate prior to exposure to a carrying-in stage for carrying the substrate into the exposing apparatus and, upon receiving a carrying-out ready signal for the substrate from the exposing apparatus, receive each substrate after exposure from a carrying-out stage for carrying the substrate out of the exposing apparatus and carry it into the washing section, and wherein, upon receiving the carrying-out ready signal, the control section controls the first substrate carrying means such that the substrate on the carrying-out stage can be carried into the washing section in preference to other carrying works.

The present invention is the coating and developing method, further comprising the steps of: carrying a substrate washed in the washing section into a waiting section; bringing the substrate into a waiting state in the waiting section; taking out the substrate from the waiting section and carrying it into a periphery exposing section, by using a second substrate carrying means; providing exposure to the periphery of the substrate in the periphery exposing section prior to a heating process in a heating section; and carrying the substrate having been subjected to a periphery exposing process in the periphery exposing section into the heating section, by using the second substrate carrying means; wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

The present invention is the coating and developing method, further comprising the step of forming a water-repellent protective film for protecting the surface of each substrate upon the dipping exposure process, by coating a chemical liquid on a resist film formed in a coating unit in a protective film forming section.

The present invention is the coating and developing method, further comprising the steps of: carrying a substrate washed in the washing section into a waiting section; bringing the substrate into a waiting state in the waiting section; taking out the substrate from the waiting section and carrying it into a periphery exposing section, by using a second substrate carrying means; providing exposure to the periphery of the substrate in the periphery exposing section prior to a heating process in a heating section; and carrying the substrate having been subjected to a periphery exposing process in the periphery exposing section into the heating section, by using the second substrate carrying means; wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

The present invention is the coating and developing method, further comprising the step of forming a water-repellent protective film for protecting the surface of each substrate upon the dipping exposure process, by coating a chemical liquid on a resist film formed in a coating unit in a protective film forming section.

The present invention is another coating and developing method further comprising the step of forming a water-repellent protective film for protecting the surface of each substrate upon the dipping exposure process, by coating a chemical liquid on a resist film formed in a coating unit in a protective film forming section.

The present invention is a storage medium for storing a computer-readable program which can be read by a computer for use in a coating and developing apparatus adapted to form a resist film by coating a resist liquid on a substrate, heat the substrate in a heating section after it has been subjected to a dipping exposure process in an exposing apparatus, and then perform a developing process in a developing section, the computer-readable program including a group of steps for performing a coating and developing method for forming a resist film by coating a resist liquid on a substrate, heating the substrate in a heating section after it has been subjected to a dipping exposure process in an exposing apparatus, and then performing a developing process in a developing section, and the coating and developing method comprising the steps of: carrying the substrate carried out from the exposing apparatus after the dipping exposure process into a washing section, by using a first substrate carrying means; and washing the surface of the substrate in the washing section; wherein a control section controls the first substrate carrying means such that the substrate can be washed in the washing section in a period of time prior to a time zone in which the size of liquid drops remaining on the substrate due to the dipping exposure process becomes smaller quite rapidly, based on a carrying-out ready signal for the substrate from the exposing apparatus, by using a relationship between the time elapsed after the end of the dipping exposure process and the size of liquid drops remaining on the substrate due to the dipping exposure process.

Liquid drops attached onto a substrate will become smaller in size quite rapidly after some period of time has elapsed after the attachment, thus degenerated layers (water marks) are formed in a resist film on the substrate. The present invention addresses this problem, and is hence constructed to control conveyance of each substrate such that it can be washed in a washing section in a period of time prior to a time zone in which the size of liquid drops becomes smaller quite rapidly. Accordingly, the occurrence of degenerated layers of the resist film can be controlled, thereby suppressing adverse effect on resolution of the resist pattern due to remaining water drops.

According to the present invention, the time to be taken from washing a substrate having been subjected to a dipping exposure process, through providing a periphery exposing process to the substrate, to heating the substrate after being subjected to the dipping exposure can be adjusted among wafers. Specifically, the time to be taken from a point of time the washing of each substrate in a washing section starts to a point of time the substrate is carried into a periphery exposing section can be set at a predetermined time. Accordingly, when the substrate is carried out from the periphery exposing section, the time elapsed after the dipping exposure process is approximately equal among wafers. Therefore, by carrying each substrate having been subjected to the periphery exposing process into the heating section in preference to other carrying works, the time elapsed described above can be adjusted among wafers and also the reduction of throughput can be controlled. In the case where the adjustment of the time elapsed from the dipping exposure to the heating process is performed in the heating section, the time of stay for each wafer in the heating section becomes longer, thus the number of heating sections should be increased. However, according to the present invention, the number of heating sections can be reduced.

DETAILED DESCRIPTION OF THE INVENTION

EXAMPLES

Figure 1:
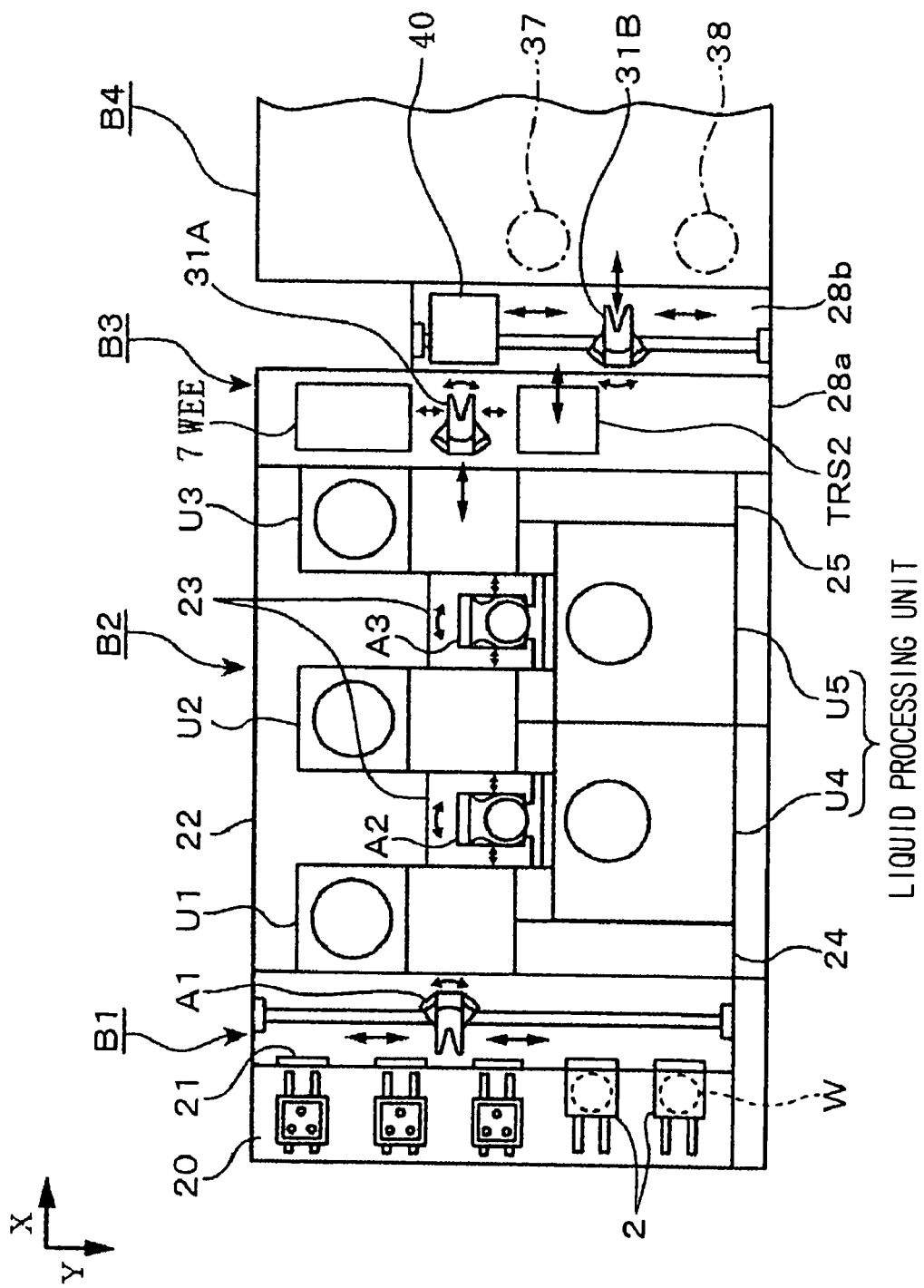
FIG. 1 is a plan view showing one embodiment of a coating and developing apparatus according to the present invention.
Figure 2:
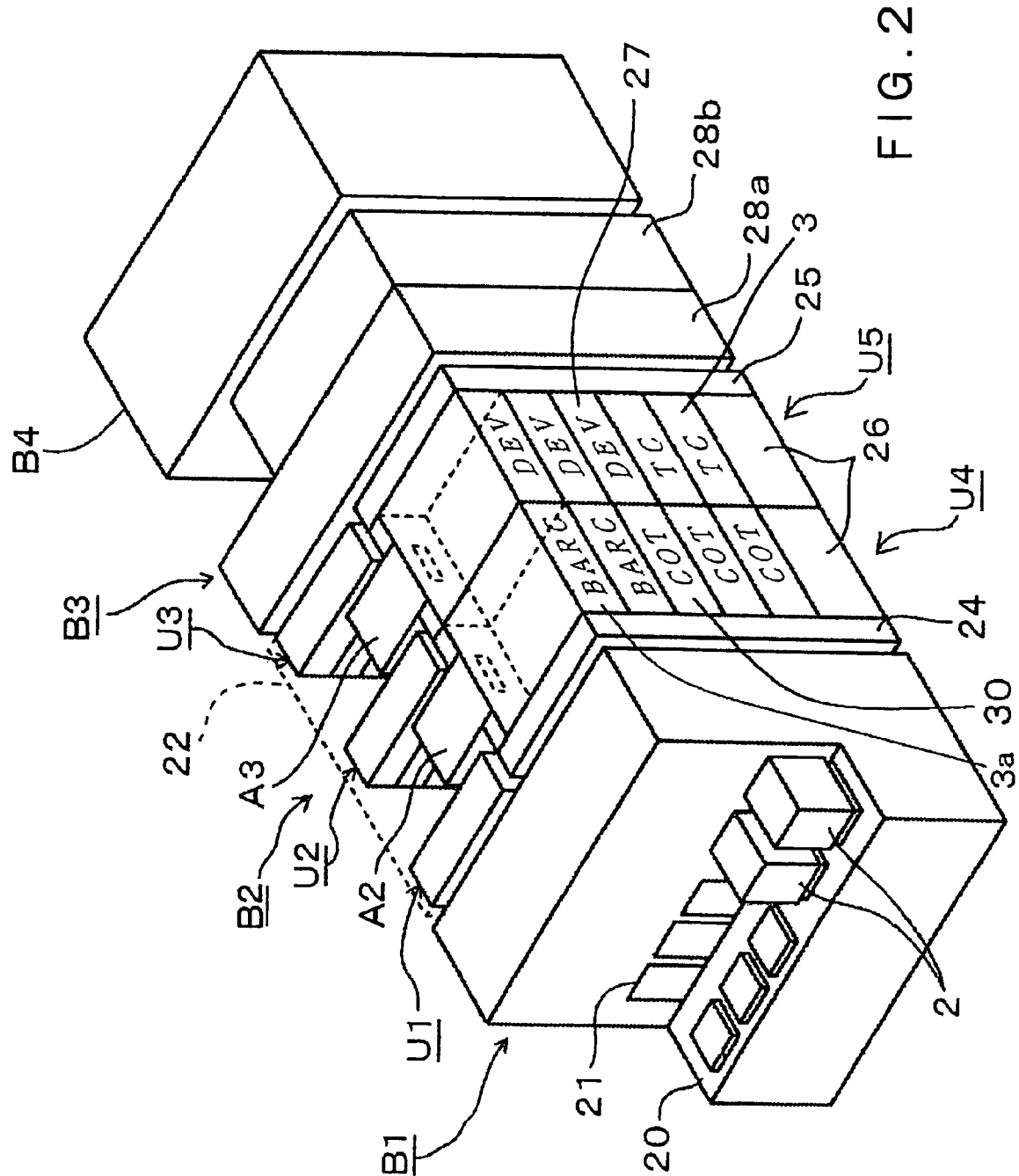
FIG. 2 is a perspective view showing the embodiment of a coating and developing apparatus according to the present invention.

The whole construction of a system in which an exposing apparatus is connected with a coating and developing apparatus according to the present invention will be described briefly with reference to FIGS. 1 and 2. In FIGS. 1 and 2, reference character B1 designates a carrier station for carrying in and carrying out carriers 2, in which, for example, thirteen sheets of substrates are contained. The carrier station B1 includes a placing section 20 in which carriers 2 can be arranged in large numbers, opening and closing sections 21 each provided in a front wall when viewed from the placing section 20, and a transfer means A1 adapted to take out a wafer W from each carrier 2 via the corresponding opening and closing section 21.

On the back side of the carrier station B1, a processing block B2 which is surrounded by a housing 22 is provided. The processing block B2 includes rack units U1, U2, U3 successively arranged from the front side and each composed of heating and cooling units provided in a multistage fashion, liquid processing units U4, U5, and main carrying means A2, A3 each constituting a substrate carrying means for transferring a wafer W between the respective units U1, U2, U3, U4, U5. The main carrying means A2, A3 are placed in a space defined by each corresponding face of the rack units U1, U2, U3 arranged in series from the front to back side when viewed from the carrier station B1, each corresponding face of the liquid units U4, U5 on the right side which will be described below, and partition walls 23 constituting one face on the left side together with the rack units U1, U2, U3. Reference numerals 24, 25 in FIGS. 1 and 2 are temperature control equipments for a processing liquid used in each unit or temperature and humidity control units provided with a duct or the like for controlling temperature and humidity.

Each of the liquid processing units U4, U5 is provided, as shown in FIG. 2, on a chemical liquid container 26 for a resist liquid or developing liquid. Namely, each of the liquid processing unit U4, U5 includes coating units (COT) 30 each adapted to coat a resist liquid on a surface of each wafer W, protective film forming units (TC) 3 each serving as a protective film forming section for forming a water-repellent protective film on the surface of wafer W on which the resist film has been formed, developing units (DEV) 27 each adapted to coat a developing liquid on the surface of wafer W, and antireflection film units (BARC) 3a, these units being layered in a five-staged fashion, for example. Each of the rack units U1, U2, U3 includes various units for performing pre-treatments and/or post-treatments for the processes to be provided in the liquid processing units U4, U5, the units for those treatments being layered in a ten-staged fashion, for example. Specifically, each or the rack units U1, U2, U3 includes heating units for heating or baking each wafer W and cooling units for cooling the wafer W, or the like.

Figure 3:
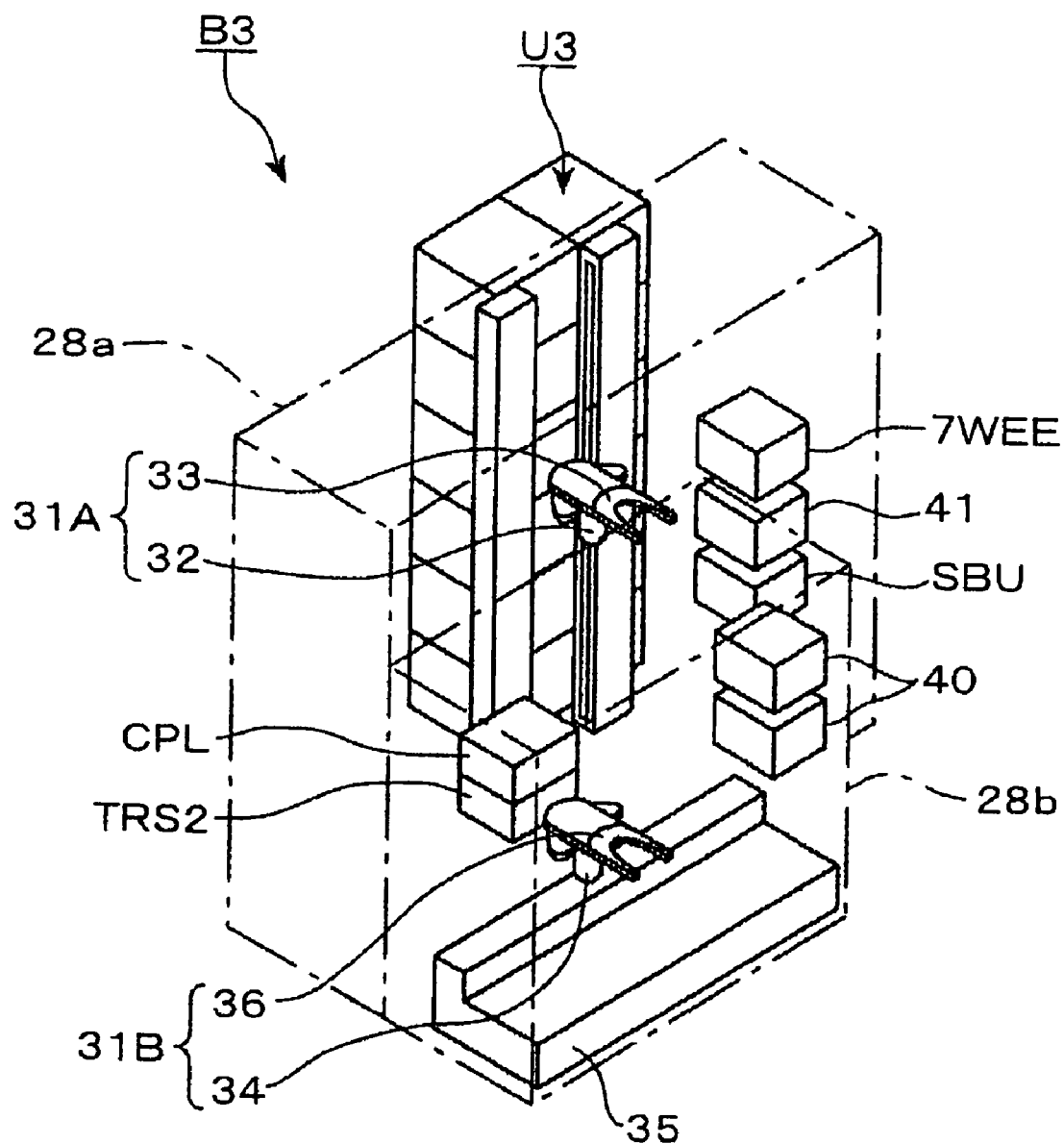
FIG. 3 is a schematically perspective view showing an interface section in the coating and developing apparatus.

On the back side of the rack unit U3 of the processing block B2, an exposing apparatus B4 is provided via an interface section B3. Hereinafter, the interface section B3 is described with reference to FIGS. 1, 2 and 3. The interface section B3 includes a first carrying chamber 28a and a second carrying chamber 28b provided between the processing block B2 and the exposing apparatus B4. In the first carrying chamber 28a and the second carrying chamber 28b, a main carrying section 31A and a sub-carrying section 31B are provided, respectively. These main carrying section 31A and sub-carrying section 31B constitute a substrate carrying means.

In the first carrying chamber 28a, on the left side when viewed from the carrier station B1 with respect to the main carrying section 31A, a periphery exposing section (WEE) 7 adapted to selectively expose only an edge portion of each wafer W, a waiting section 41 adapted to bring each wafer W washed in a washing section 40 described below into a waiting state, a buffer cassette (SBU) for temporarily containing a plurality of, for example, twenty five, sheets of wafer W are arranged vertically. On the right side in the first carrying chamber 28a, a transfer unit (TRS2) and a high-precision temperature control unit (CPL) composed of, for example, a cooling plate are provided in a vertically layered fashion.

Figure 4:
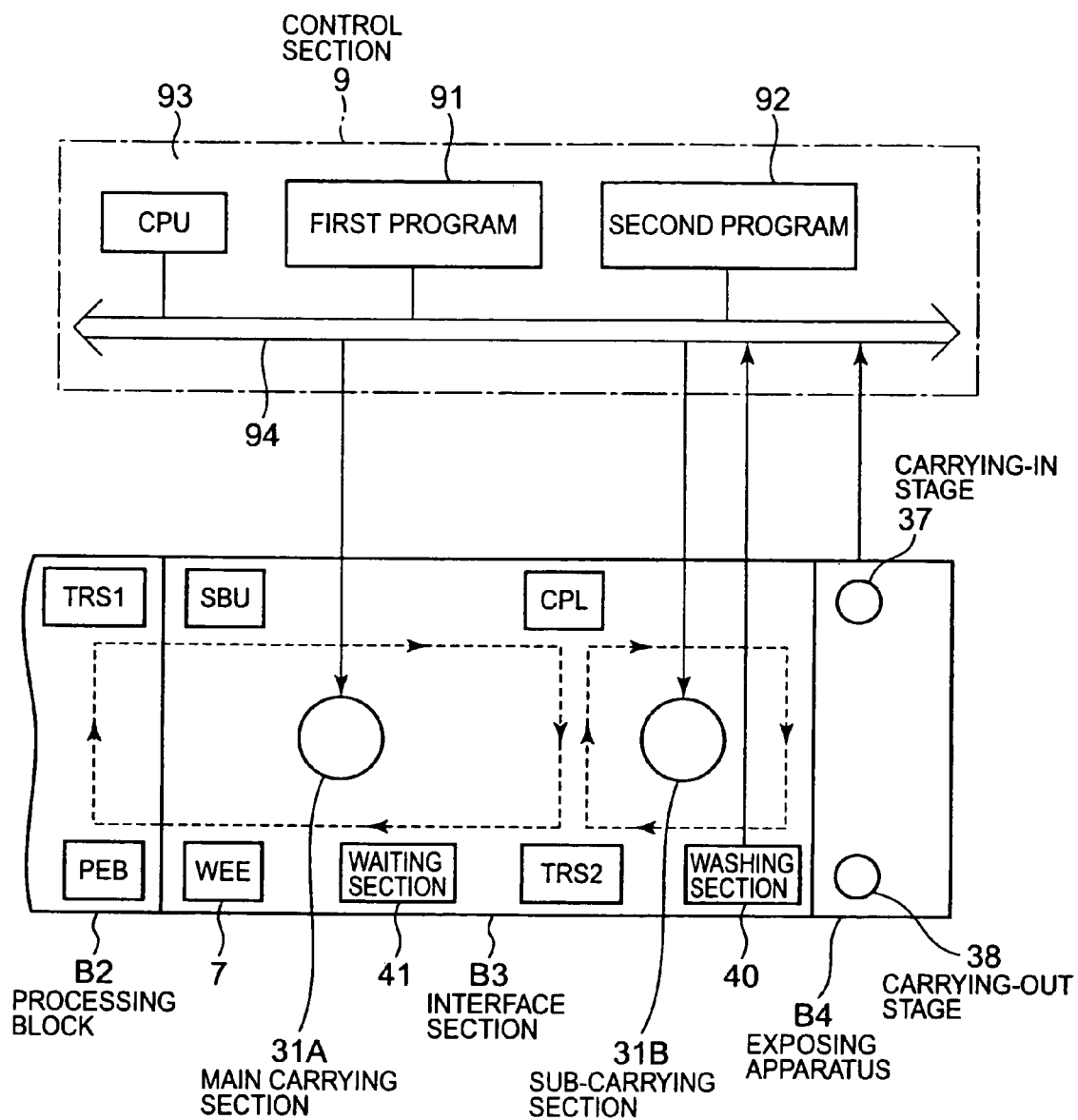
FIG. 4 is a plan view showing a carrying route for each wafer and a controlling section in the coating and developing apparatus.

FIG. 4 illustrates a relationship between a carrying route for each wafer W to be carried by the main carrying section 31A and sub-carrying section 31B and a control system for these carrying section 31A and 31B. As shown in FIG. 4, the main carrying section 31A carries each wafer W, prior to exposure, placed on the transfer unit (TRS1) of the rack unit U3, successively, from the buffer cassette (SBU) to the high-precision temperature control unit (CPL). The main carrying section 31A also serves to carry each wafer after exposed and then placed on the transfer unit (TRS2) by the sub-carrying section 31B, successively, from the waiting section 4 to the periphery exposing section (WEE) 7 and the heating unit (PEB). In this example, the sub-carrying section 31B corresponds to a first substrate carrying means, while the main carrying section 31A corresponds to a second substrate carrying means.

The sub-carrying section 31B includes bodies 34 which can be optionally moved along the vertical direction and rotated about the vertical axis, and these bodies 34 can also move right and left by a guide mechanism 35. In addition, an arm 36 which can be optionally advanced and retracted is provided over the bodies 34. In the second carrying chamber 28b, on the left side of the sub-carrying section 31B when viewed from the carrier station B1, the washing section 40 adapted to wash the surface of each wafer W prior to a dipping exposure process is provided.

The sub-carrying section 31B, as shown in FIG. 4, carries each wafer W in the high-precision temperature control unit (CPL) into a carrying-in stage 37 of the exposing apparatus B4 as well as carries each wafer W on a carrying-out stage 38 of the exposing apparatus B4 into the transfer unit (TRS2). The main carrying section 31A and the sub-carrying section 31B are controlled by a controller (not shown) based on instructions from a control section 9 described below.

Figure 5:
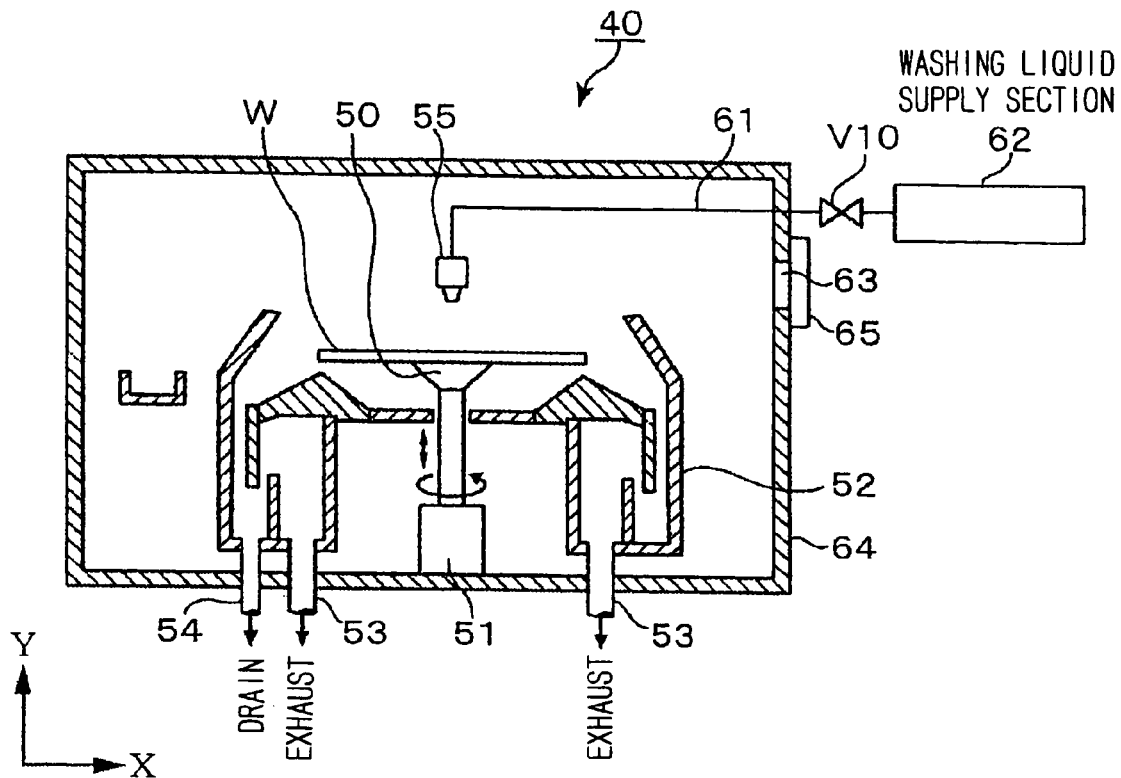
FIG. 5 is a schematic cross section showing a washing section provided in the interface section.

Next, the structure of the washing section 40 will be briefly described with reference to FIG. 5. As shown in FIG. 5, the washing section 40 has a spin chuck constituting a substrate holding portion 50. The spin chuck is configured to hold a wafer horizontally by vacuum suction. The spin chuck 50 can be rotated about the vertical axis as well as moved along the vertical direction by a driving section 51. Around the spin chuck 50, a cup 52 is provided such that it surrounds the outer periphery of the spin chuck 50 and partly covers a wafer W. At the bottom face of the cup 52, an exhaust section including an exhaust pipe 53 and a drain pipe 54 is provided.

In FIG. 5, reference numeral 55 denotes a washing liquid supply nozzle for supplying a washing liquid to approximately the center of wafer W, the washing liquid supply nozzle 55 being connected with a washing liquid supply section 62 for supplying a washing liquid, for example, pure water via a supplying line 61. A valve V10 is provided to the supplying line 61. Reference numeral 63 in FIG. 5 designates an entrance for each wafer W, which is formed in a wall facing a carrying-in region of the sub-carrying section 31B in a processing chamber 64. At the entrance 63, an opening and closing shutter 65 is provided.

Figure 6:
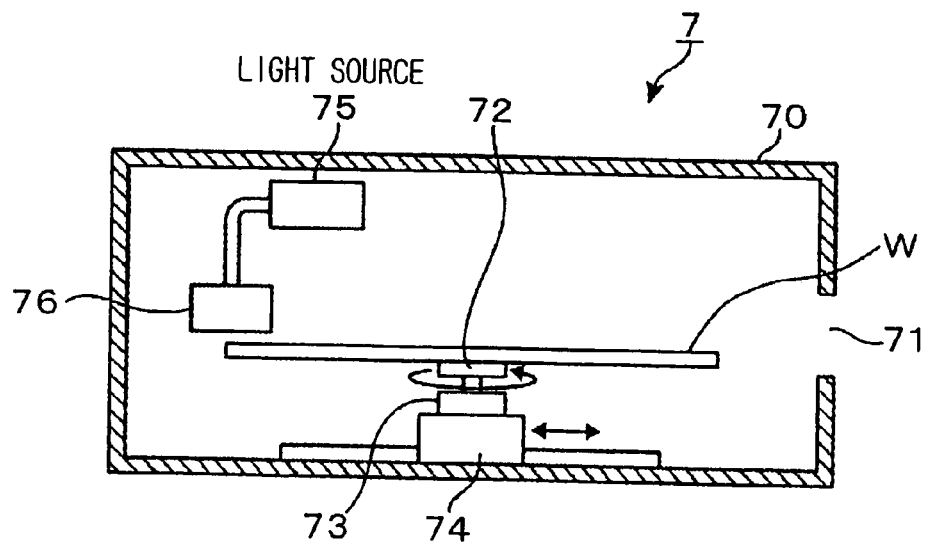
FIG. 6 is a schematic cross section showing a periphery exposing section provided in the interface section.

Next, the structure of the periphery exposing section (WEE) 7 will be briefly described with reference to FIG. 6. In a housing 70 having an entrance 71, a stage 72 composed of a vacuum chuck is provided, and a driving section of the stage 72 includes a guide mechanism 74 and a rotating mechanism 73, such that the stage 72 can be optionally moved linearly and rotated about the vertical axis. Light emitted from a light source 75, for example, an extra-high pressure mercury lamp or xenon flash lamp, to the periphery of the surface of wafer W placed on the stage 72 is radiated onto the surface of wafer W through a light radiating portion 76 having a rectangular slit. The stage 72 can be moved linearly in the radial direction of the wafer W in a predetermined exposure region. In such a periphery exposure section (WEE) 7, the periphery of each wafer W can be exposed successively due to rotation and linear movement of the stage 72.

Figure 7:
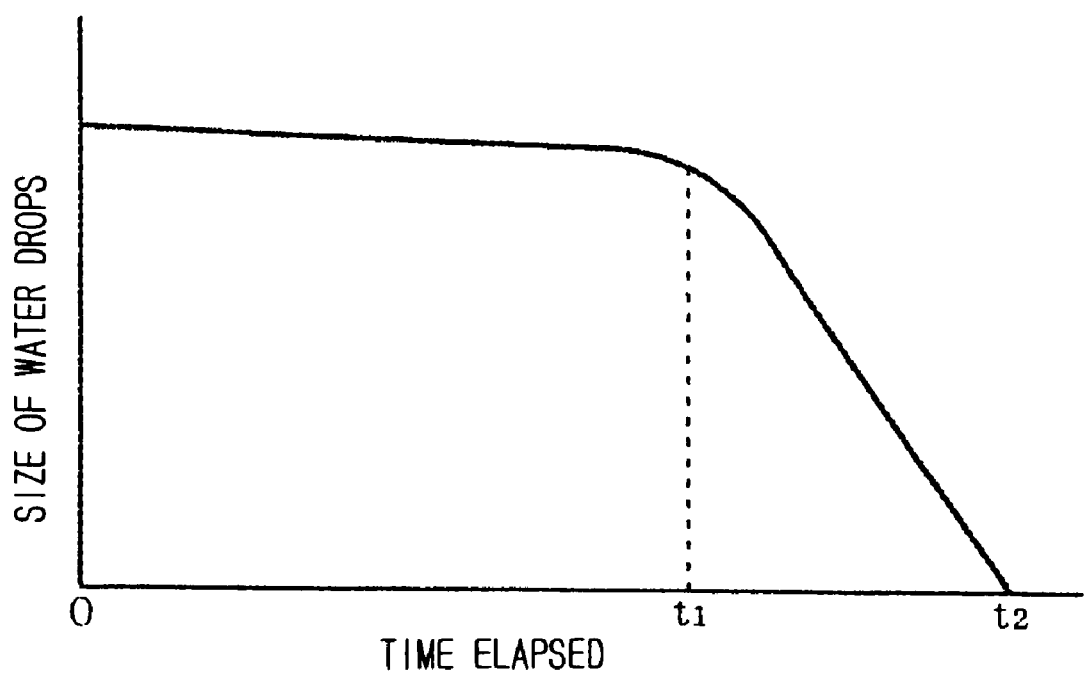
FIG. 7 is a graph showing the relationship between the sizes of water drops and the time elapsed.

The coating and developing apparatus described above, as shown in FIG. 4, comprises the control section 9 including a computer for controlling the drive of the aforementioned main carrying section 31 and sub-carrying section 31B. The controlling section 9 has a first program 91, a second program 92 and a central processing unit (CPU) 93. In FIG. 4, reference numeral 94 denotes a bus. Next, liquid drops remaining on a substrate due to the dipping exposure process will be described with reference to FIG. 7. Liquid drops remaining on a substrate become small gradually in size with time, and the size becomes smaller quite rapidly at a point of time, for example, t1 shown in FIG. 7, then disappear at t2. The first program 91 stores a predetermined relationship between the time elapsed after the end point of the dipping exposure process and the size of liquid drops remaining on the substrate due to dipping exposure process, and controls the carrying operation performed by the sub-carrying section 31B such that each wafer W can be washed by the washing section 40 in a period of time prior to a time zone in which the size of liquid drops becomes smaller quite rapidly as shown in FIG. 7, i.e., in a period of time before the point of time t1. The control section 9, although not shown, includes programs necessary for executing the washing process of wafer W in the washing section 40 and those necessary for providing the periphery exposing process to each wafer W in the periphery exposing section 7.

Figure 11:
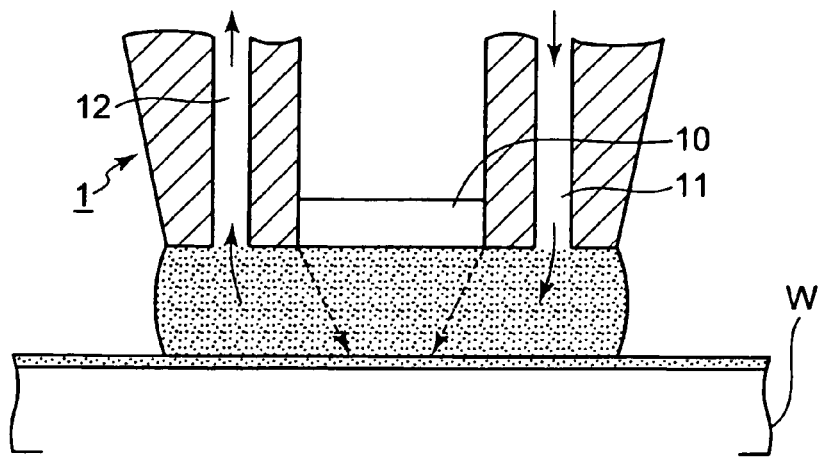
FIG. 11 is an illustration showing an exposing means for providing a dipping exposure process to a wafer.
Figure 12:
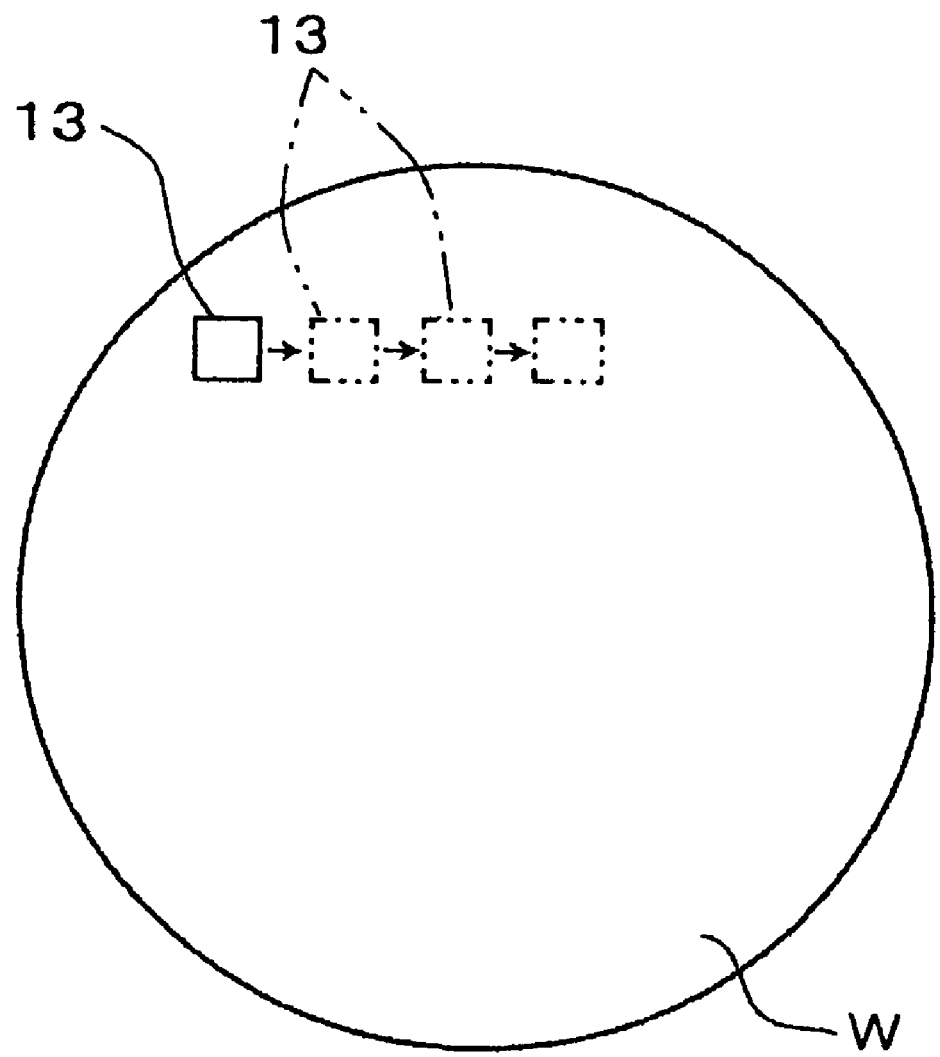
FIG. 12 is an illustration showing one aspect of providing a dipping exposure process to a wafer surface by using the exposing means.

Liquid drops having a diameter of from 0.5 μm to 1 μm remain on the surface of wafer W immediately after the exposing process because a liquid layer of, for example, pure water is formed on the wafer W upon the dipping exposure process as described above (see, FIGS. 11, 12). The size of the liquid drops changes as shown in FIG. 7 from the point of time the liquid layer disappears, i.e., from the point of time the exposing process is ended, and the time elapsed from the end point of exposure to the point of time t1 when the size becomes smaller quite rapidly is approximately 60 seconds. Accordingly, the first program 91 controls the sub-carrying section 31B serving as a substrate carrying means such that each wafer W to be washed is carried in the washing section 40 within, for example, 30 seconds from the point of time the dipping exposure for the wafer W is ended.

In this embodiment, upon receiving a carrying-out ready signal (out-ready signal) of wafer W from the exposing apparatus B4, the control section 9 controls the sub-carrying section 31B such that it carries a wafer W on the carrying-out stage 38 into the washing section 40 in preference to other carrying works to be performed by the sub-carrying section 31B. As used herein, the other carrying work does not mean a work which is ongoing upon receiving the carrying-out ready signal, but means a work to be performed following the ongoing work. Namely, in this example, the sum total of the longest time taken from the end of exposure to generation of the carrying-out ready signal and the longest time taken from the generation of the carrying-out ready signal to a point of time when a wafer W on the carrying-out stage 38 is carried into the washing section 40 (or the time taken for the sub-carrying section 31B in the case of starting another carrying work upon the generation of the carrying-out ready signal) is shorter than the time taken from the point of time the dipping exposure of the wafer W is ended to the point of time t1 at which the size of liquid drops becomes smaller quite rapidly.

In the case of a chemically amplified type resist as described above, it is preferred that the time (PED time) taken from the end of exposure for each wafer W to start of heating at the heating section (PEB) is properly adjusted among wafers W. In this embodiment, the second program 92 is employed for controlling the PED time. The second program 92 brings each wafer W into a waiting state at the waiting section 41 such that the time taken from start of washing a wafer W in the washing section 40 to a point of time when the wafer W is carried into the periphery exposing section 7 can be adjusted at a predetermined setting time Ta. The second program 92 controls the main carrying section 31A such that a wafer W having been subjected to the periphery exposing process is carried into the heating section (PEB) in preference to other carrying works to be performed by the main carrying section 31A. For example, with respect to the setting time Ta, for example, the sum total of the longest time taken from the end of exposure to generation of the carrying-out ready signal and the shortest time taken from the generation of the carrying-out ready signal to start of heating the wafer at the heating section (PEB) is set at the PED time, and the setting time Ta is determined based on the PED time.

The first program 91 and second program 92 are stored in a storage medium, for example, a flexible disc (FD), memory card, compact disc (CD), magnet optical disc (MO) or the like, and are installed in a computer which serves as the control section 9.

Next, the operation of the above embodiment will be described. First, the flow of wafers in the aforementioned coating and developing apparatus will be described. When a carrier 2 in which wafers W are contained is placed on the placing section 20 from the exterior, the opening and closing section 21 is opened and a cover of the carrier 2 is removed so that a wafer W is taken out by the transfer means A1. Then, the wafer W is transferred to the main carrying means A2 via a transfer unit (not shown) constituting one stage of the rack unit U1. Thereafter, in one stage of the rack units U1 or U2, for example, a hydrophobicity rendering process or cooling process is performed as a pre-treatment for the coating process. Subsequently, a resist liquid is coated on the surface of wafer W in the coating unit (COT) 30, and a water-repellent protective film is then formed on the resist film on the surface of wafer W. Rather than employing the hydrophobicity rendering process, an antireflection film may be coated on the wafer W in the antireflection film unit (BARC) 3a. Alternatively, an antireflection film may be first formed on the resist, and a protective film as mentioned above may then be formed thereon. Next, the wafer W is heated (baked) in the heating unit (PAB) constituting one stage of the rack units U1 to U3, and cooled, then carried into the interface section B3 via the transfer unit (TRS1) of the rack unit U3. In the interface section B3, the wafer W is carried, by the main carrying section 31A, from the buffer cassette (SBU) to the high precision temperature control unit (CPL). Then, the wafer W placed on the high precision temperature control unit (CPL) is carried into the carrying-in stage 37 (for carrying the wafer W into the exposing apparatus B4) of the exposing apparatus B4 by the sub-carrying section 31B, so that the dipping exposure is performed in the exposing apparatus B4. Thereafter, the exposed wafer W is carried, as described below, by the sub-carrying section 31B, from the carrying-out stage 38 through the washing section 40 to the transfer unit (TRS2), and is then carried, by the main carrying section 31A, from the transfer unit (TRS2) through the waiting section 41 and the periphery exposing section (WEE) to the heating unit (PEB) of the rack unit U3. Subsequently, the wafer W is carried into the developing unit (DEV) constituting one stage of the liquid processing unit US, and a developing liquid is supplied onto the surface of wafer W so as to develop the resist, thus forming a resist mask of a predetermined pattern. Thereafter, the wafer W is returned, by the transfer means A1, to the original carrier 2 on the placing table 20.

Figure 8:
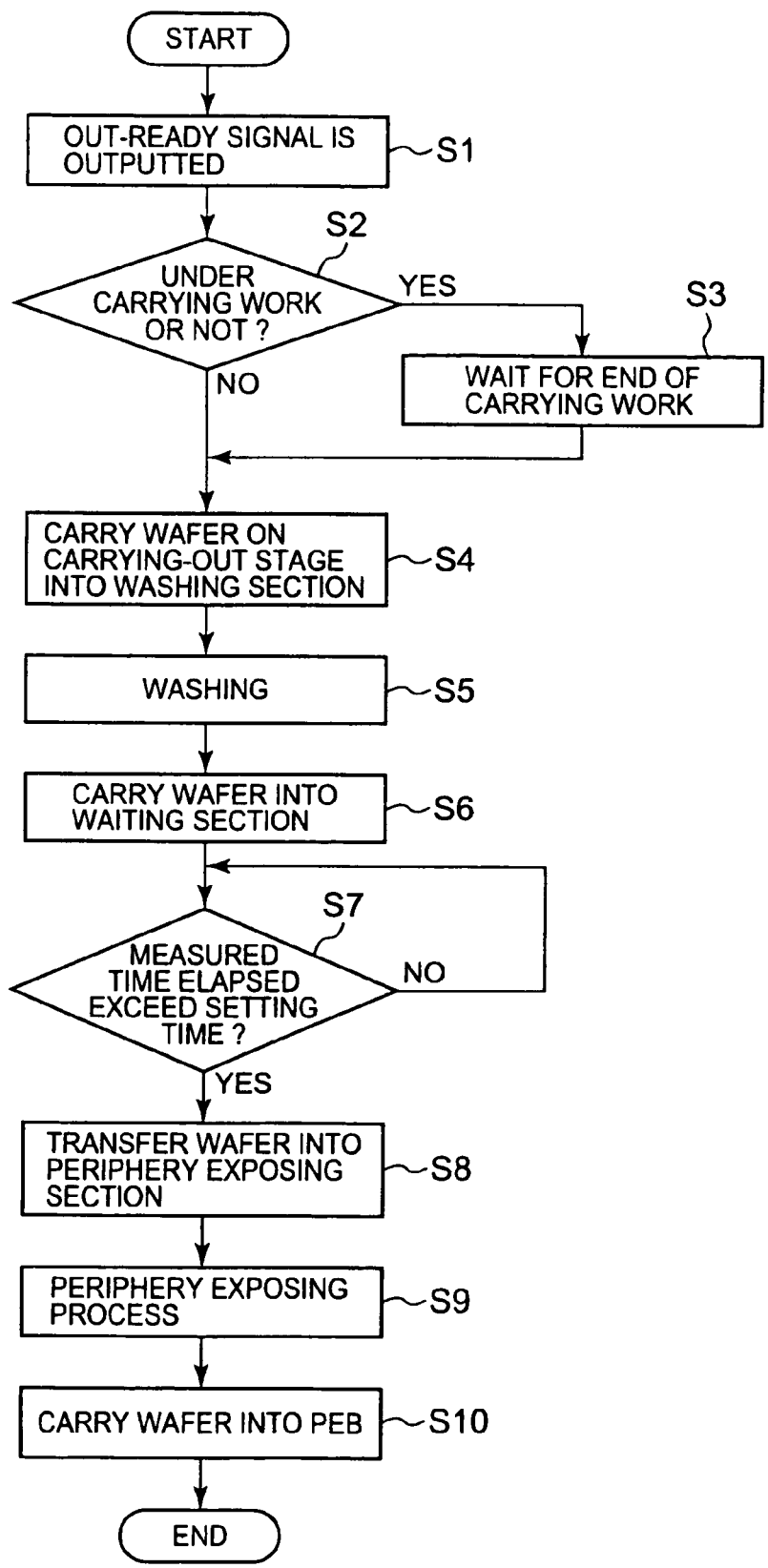
FIG. 8 is a flow chart showing a carriage control flow until a wafer after subjected to exposure reaches a heating section in the embodiment described above.

Next, the mode of carrying the wafer W having been subjected to the dipping exposure into the heating section (PEB) will be described with reference to FIGS. 8 to 10. Once the dipping exposure process is ended, the processed wafer W is placed on the carrying-out stage 38, and at the same time, the carrying-out ready signal (out-ready signal) is outputted from the exposing apparatus B4 to the control section 9 (Step S1). At this time, whether the sub-carrying section 31B (the first substrate carrying means) is under the carrying work or not is judged (Step S2). If under the carrying work, the sub-carrying section 31B waits for the end of the carrying work (Step S3). Otherwise, if not under the carrying work, the sub-carrying section 31B carries the wafer W on the carrying-out stage 38 into the washing section 40 in preference to other operational instructions given to the sub-carrying section 31B (Step S4).

Figure 9:
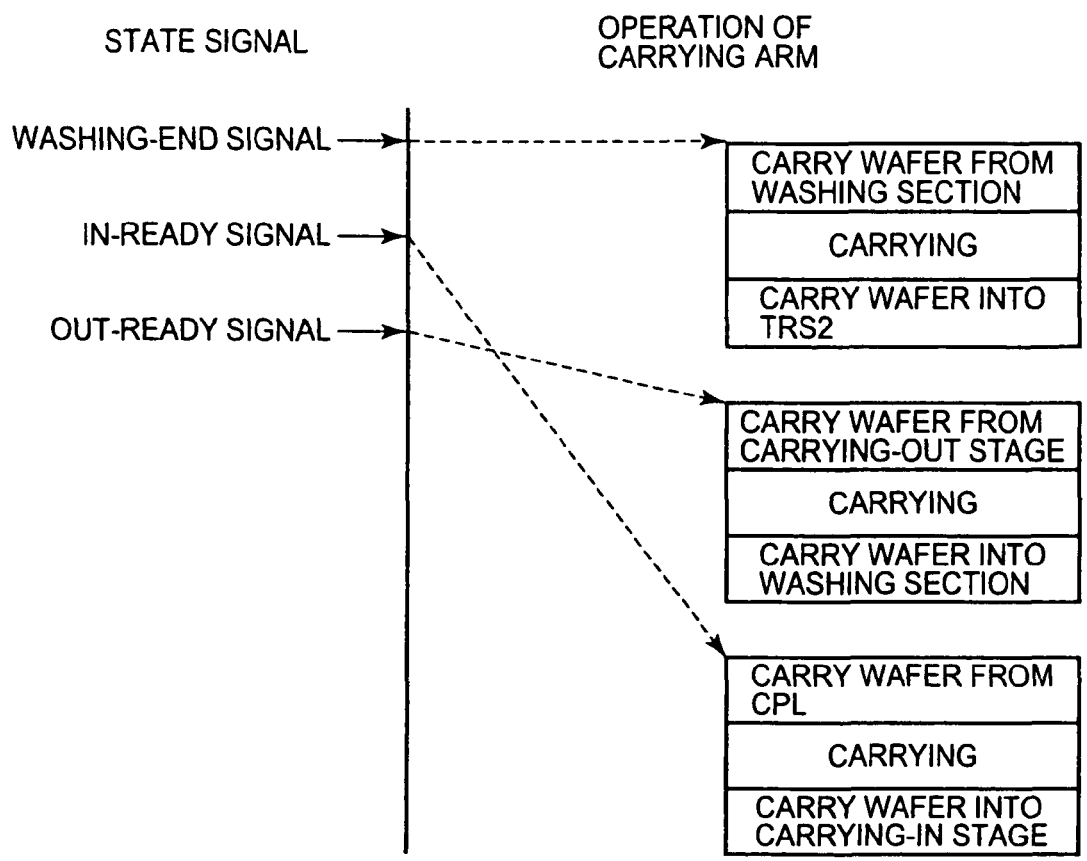
FIG. 9 is an illustration showing a state of the interface section corresponding to one example of operation of a carrying arm.
Figure 10:
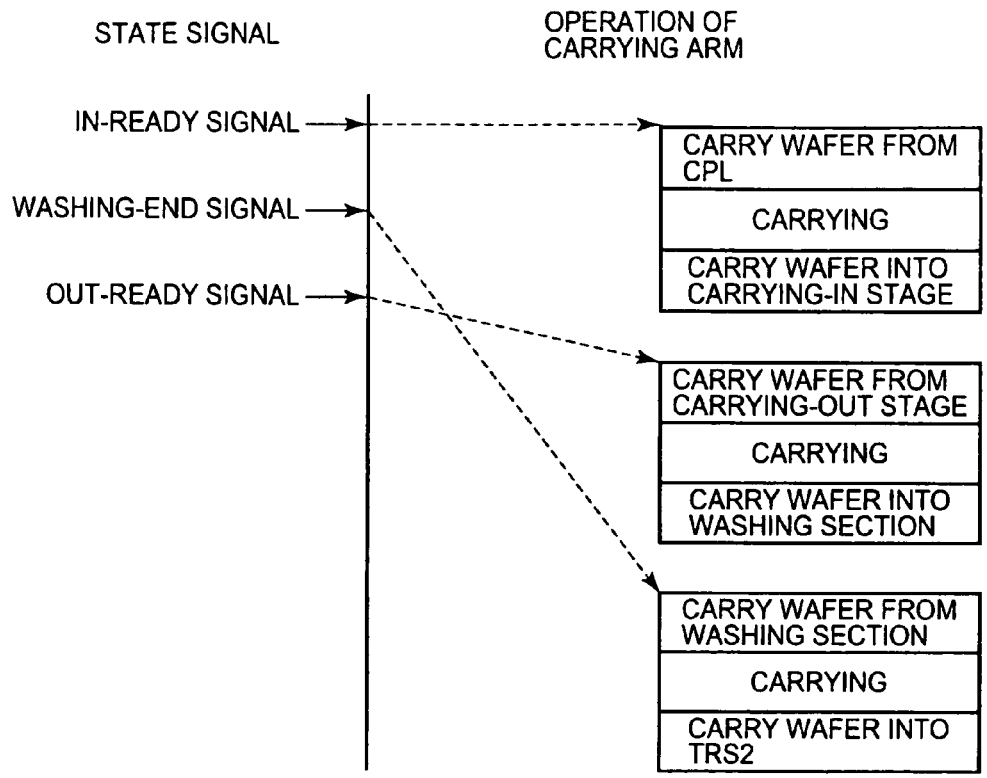
FIG. 10 is an illustration showing a state of the interface section corresponding to one example of operation of a carrying arm.

A specific example of the carriage control for the sub-carrying section 31B is shown in FIGS. 9 and 10. As shown in FIG. 9, the washing of a wafer W is ended in the washing section 40 and a washing-end signal is outputted to the control section 9, thus the sub-carrying section 31B carries the wafer W from the washing section 40 to the transfer unit TRS2. Assume that during this carrying work, a carrying-in ready signal (in-ready signal) is outputted from the exposing apparatus B4, and subsequently, an out-ready signal is outputted. In such a case, the wafer W is carried, by the sub-carrying section 31B, from the carrying-in stage 37 into the washing section 40, after the current carrying work is ended, based on the output of the out-ready signal, in preference to the output of the in-ready signal. Thereafter, the carrying work based on the in-ready signal, i.e., the work for carrying the wafer W from the high-precision temperature control unit (CPL) into the carrying-in stage 37 is performed.

In FIG. 10, an in-ready signal is outputted from the exposing apparatus B4, and based on this signal, the sub-carrying section 31B performs the work for carrying a wafer W from the high-precision temperature control unit (CPL) into the carrying-in stage 37. Assuming that during this work, a washing-end signal is outputted from the washing section 40, and subsequently, an out-ready signal is outputted, the wafer W is carried, by the sub-carrying section 31B, from the carrying-out stage 38 into the washing section 40, after the current carrying work is ended, based on the output of the out-ready signal, in preference to the output of the washing-end signal. Thereafter, the sub-carrying section 31B carries the wafer W from the washing section 40 into the transfer unit TRS2 based on the washing-end signal.

Now, returning to FIG. 8, when the wafer W is carried into the washing section 40, the valve V10 is opened to supply a washing liquid to approximately the center of rotation of the wafer W from the washing liquid supply nozzle 55. Then, the spin chuck 50 is rotated to spread the washing liquid in the radial direction of wafer W by centrifugal force so as to wash the surface of wafer W. Even after stopping the supply of the washing liquid by the valve V10, the spin chuck 50 is rotated for a while to dry the surface of wafer W (Step S5). Thereafter, the sub-carrying section 31B carries the wafer W out of the washing section 40 and transfers it to the transfer unit TRS2, then the main carrying section 31A carries the wafer W into the waiting section 41 (Step S6).

The control section 9 measures the time elapsed after the end of washing for each wafer, and judges whether the measured time elapsed exceeds the aforementioned setting time Ta for each wafer W carried in the waiting section 41 (Step S7). If not exceeding the setting time Ta, the wafer W is kept in a waiting state in the waiting section 41. If exceeding the setting time Ta, the main carrying section 31A (the second substrate carrying means), if not under the carrying work, carries the wafer W out of the waiting section 41 and transfers it into the periphery exposing section 7 (Step S8). Otherwise, if the main carrying section 31A is under the carrying work upon the above judgment, the wafer W is kept to wait for the end of the carrying work, and is then carried by the main carrying section 31A from the waiting section 41 into the periphery exposing section 7. In the case of measuring the time elapsed after the end of washing, it can be measured on the basis of a signal corresponding to the end of washing. For example, the time elapsed can be measured based on the point of time the valve V10 is closed or on the point of time the rotation of spin chuck 50 is stopped.

Subsequently, after the periphery exposing process for a wafer W has been performed (Step S9) and ended in the periphery exposing section 7, the main carrying section 31A, if not under the carrying work, carries the wafer W from the periphery exposing section 7 into the heating section PEB in preference to other carrying works (Step S10). However, if the main carrying section 31A is under the carrying work, the wafer W is kept to wait for the end of the carrying work, and is then carried from the periphery exposing section 7 into the heating section PEB. As used herein, the other carrying works means works other than the work for carrying the wafer W from the waiting section 41 into the periphery exposing section 7.

According to this embodiment, each wafer W is carried into the washing section 40 immediately after the reception of the carrying-out ready signal from the exposing apparatus B4, and is then washed in the washing section in a period of time prior to a time zone in which the size of liquid drops attached to the wafer W after subjected to the dipping exposure becomes smaller quite rapidly. Thus, occurrence of a degenerated layer of the resist film coated on the substrate can be controlled, resulting in suppression of adverse effect on resolution of the resist pattern due to remaining water drops.

The waiting time of wafer W is controlled in the waiting section 41 such that the time taken from start of washing the wafer W in the washing section 40 to a point of time the wafer W is carried into the periphery exposing section 7 can be adjusted within a predetermined setting time. The wafer W having been subjected to the periphery exposing process is carried into the heating section PEB in preference to other carrying works. Thus, the time elapsed (PED time) from the exposure to start of the heating process can be adjusted among wafers W. Although it is also possible to adjust the PED time after each wafer W is carried out from the periphery exposing section 7, unevenness of the time elapsed after exposure among wafers W becomes larger, making it difficult to achieve the carriage control for obtaining a high throughput. On the other hand, according to the present invention, the waiting time of wafer W is controlled in the waiting section 41, thus when the wafer W is carried out from the periphery exposing section, the time elapsed after the exposure can be adjusted among wafers W, resulting in facilitation of producing the carriage control program of wafers W as well as in suppression of lowering of the throughput. In the case where the adjustment of the time elapsed from the exposure to the heating is performed in the heating section, the time of staying each wafer W in the heating section becomes longer, thus the number of heating sections should be increased. However, according to the present invention, the number of heating sections can be reduced.

It is noted that while two washing sections 40 are provided in the embodiment described above, three or more washing sections may be employed, or otherwise, only one washing section may be provided. Additionally, in the embodiment described above, while each wafer W having a water-repellent protective film formed thereon is washed, another wafer W having a water-repellent resist film formed thereon may be washed in the washing section.

The invention claimed is:

1. A coating and developing apparatus including a coating unit adapted to coat a resist liquid on a substrate so as to form a resist film, a heating section adapted to heat the substrate after it has been subjected to a dipping exposure process in an exposing apparatus, and a developing section adapted to perform a developing process, the coating and developing apparatus comprising:
    a washing section adapted to wash the surface of each substrate after it has been subjected to the dipping exposure process;
    a first substrate carrying means adapted to transfer each substrate to the washing section, the substrate having been subjected to the dipping exposure process and carried out from the exposing apparatus; and
    a control section adapted to control the first substrate carrying means such that the substrate is washed in the washing section in a period of time prior to a time zone in which the size of liquid drops remaining on the substrate due to the dipping exposure process becomes smaller rapidly, based on a carrying-out ready signal for the substrate from the exposing apparatus, by using a relationship between the time elapsed after the end of the dipping exposure process and the size of liquid drops remaining on the substrate due to the dipping exposure process, wherein the size of liquid drops remaining on the substrate gradually becomes smaller initially and, in the time zone, become smaller more rapidly.

2. The coating and developing apparatus according to claim 1,
    wherein the first substrate carrying means is configured to transfer each substrate prior to exposure to a carrying-in stage for carrying the substrate into the exposing apparatus as well as to receive the substrate after exposure from a carrying-out stage for carrying the substrate out of the exposing apparatus and carry it into the washing section, and
    wherein the control section controls the first substrate carrying means such that the substrate on the carrying-out stage can be carried into the washing section, in preference to other carrying works, upon receiving the carrying-out ready signal for the substrate from the exposing apparatus.

3. The coating and developing apparatus according to claim 2, further comprising:
    a waiting section adapted to bring each substrate washed in the washing section into a waiting state;
    a periphery exposing section adapted to provide exposure to the periphery of the substrate carried out from the waiting section prior to a heating process in the heating section; and
    a second substrate carrying means adapted to take out the substrate from the waiting section and carry it into the periphery exposing section, and further carry the substrate from the periphery exposing section to the heating section;
    wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

4. The coating and developing apparatus according to claim 2, further comprising a protective film forming section adapted to form a water-repellent protective film for protecting the surface of each substrate upon a dipping exposure process, by coating a chemical liquid on a resist film coated on the substrate in a coating unit.

5. The coating and developing apparatus according to claim 1, further comprising:
    a waiting section adapted to bring a substrate washed in the washing section into a waiting state;
    a periphery exposing section adapted to provide exposure to the periphery of the substrate carried out from the waiting section prior to a heating process in the heating section; and
    a second substrate carrying means adapted to take out the substrate from the waiting section and carry it into the periphery exposing section, and further carry the substrate from the periphery exposing section to the heating section;
    wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

6. The coating and developing apparatus according to claim 5, further comprising a protective film forming section adapted to form a water-repellent protective film for protecting the surface of each substrate upon a dipping exposure process, by coating a chemical liquid on a resist film coated on the substrate in a coating unit.

7. The coating and developing apparatus according to claim 1, further comprising a protective film forming section adapted to form a water-repellent protective film for protecting the surface of each substrate upon a dipping exposure process, by coating a chemical liquid on a resist film coated on the substrate in a coating unit.

8. A coating and developing method including the steps of forming a resist film by coating a resist liquid on a substrate, heating the substrate in a heating section, the substrate having been subjected to a dipping exposure process in an exposing apparatus, and then performing a developing process in a developing section, the method comprising the steps of:
carrying the substrate carried out from the exposing apparatus after the dipping exposure process into a washing section, by using a first substrate carrying means;
washing the surface of the substrate in the washing section; and
controlling, by a control section, the first substrate carrying means such that the substrate is washed in the washing section in a period of time prior to a time zone in which the size of liquid drops remaining on the substrate due to the dipping exposure process becomes smaller rapidly, based on a carrying-out ready signal for the substrate from the exposing apparatus, by using a relationship between the time elapsed after the end of the dipping exposure process and the size of liquid drops remaining on the substrate due to the dipping exposure process, wherein the size of liquid drops remaining on the substrate gradually becomes smaller initially and, in the time zone, become smaller more rapidly.

9. The coating and developing method according to claim 8,
wherein the first substrate carrying means is configured to transfer each substrate prior to exposure to a carrying-in stage for carrying the substrate into the exposing apparatus and, upon receiving a carrying-out ready signal for the substrate from the exposing apparatus, receive the substrate after exposure from a carrying-out stage for carrying the substrate out of the exposing apparatus and carry it into the washing section, and
wherein, upon receiving the carrying-out ready signal, the control section controls the first substrate carrying means such that the substrate on the carrying-out stage can be carried into the washing section in preference to other carrying works.

10. The coating and developing method according to claim 9, further comprising the steps of:
carrying a substrate washed in the washing section into a waiting section;
bringing the substrate into a waiting state in the waiting section;
taking out the substrate from the waiting section and carrying it into a periphery exposing section, by using a second substrate carrying means;
providing exposure to the periphery of the substrate in the periphery exposing section prior to a heating process in a heating section; and
carrying the substrate having been subjected to a periphery exposing process in the periphery exposing section into the heating section, by using the second substrate carrying means;
wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

11. The coating and developing method according to claim 9, further comprising the step of forming a water-repellent protective film for protecting the surface of each substrate upon the dipping exposure process, by coating a chemical liquid on a resist film formed in a coating unit in a protective film forming section.

12. The coating and developing method according to claim 8, further comprising the steps of:
carrying a substrate washed in the washing section into a waiting section;
bringing the substrate into a waiting state in the waiting section;
taking out the substrate from the waiting section and carrying it into a periphery exposing section, by using a second substrate carrying means;
providing exposure to the periphery of the substrate in the periphery exposing section prior to a heating process in a heating section; and
carrying the substrate having been subjected to a periphery exposing process in the periphery exposing section into the heating section, by using the second substrate carrying means;
wherein the control section controls the second substrate carrying means such that it brings the substrate into a waiting state in the waiting section so as to adjust the time to be taken from a point of time the washing of the substrate starts in the washing section to a point of time the substrate is carried into the periphery exposing section, at a predetermined setting time, as well as it carries the substrate having been subjected to a periphery exposing process from the periphery exposing section into the heating section in preference to other carrying works.

13. The coating and developing method according to claim 12, further comprising the step of forming a water-repellent protective film for protecting the surface of each substrate upon the dipping exposure process, by coating a chemical liquid on a resist film formed in a coating unit in a protective film forming section.

14. The coating and developing method according to claim 8, further comprising the step of forming a water-repellent protective film for protecting the surface of each substrate upon the dipping exposure process, by coating a chemical liquid on a resist film formed in a coating unit in a protective film forming section.

15. A storage medium for storing a computer-readable program to be read and executed by a computer for use in a coating and developing apparatus adapted to form a resist film by coating a resist liquid on a substrate, heat the substrate in a heating section after it has been subjected to a dipping exposure process in an exposing apparatus, and then perform a developing process in a developing section, the computer-readable program including a group of steps for performing a coating and developing method for forming a resist film by coating a resist liquid on a substrate, heating the substrate in a heating section after it has been subjected to a dipping exposure process in an exposing apparatus, and then performing a developing process in a developing section, and the coating and developing method comprising the steps of:

carrying the substrate carried out from the exposing apparatus after the dipping exposure process into a washing section, by using a first substrate carrying means;

washing the surface of the substrate in the washing section; and controlling, by a control section, the first substrate carrying means such that the substrate is washed in the washing section in a period of time prior to a time zone in which the size of liquid drops remaining on the substrate due to the dipping exposure process becomes smaller rapidly, based on a carrying-out ready signal for the substrate from the exposing apparatus, by using a relationship between the time elapsed after the end of the dipping exposure process and the size of liquid drops remaining on the substrate due to the dipping exposure process, wherein the size of liquid drops remaining on the substrate gradually becomes smaller initially and, in the time zone, become smaller more rapidly.

\* \* \* \* \*